US010741247B1

(12) United States Patent
Yeh et al.

(10) Patent No.: US 10,741,247 B1
(45) Date of Patent: Aug. 11, 2020

(54) 3D MEMORY ARRAY DEVICE AND METHOD FOR MULTIPLY-ACCUMULATE

(71) Applicant: MACRONIX International Co., Ltd., Hsinchu (TW)

(72) Inventors: Teng-Hao Yeh, Hsinchu County (TW); Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 16/449,158

(22) Filed: Jun. 21, 2019

(51) Int. Cl.
*G11C 16/04* (2006.01)
*G11C 16/26* (2006.01)
*G06F 7/544* (2006.01)
*H01L 27/1157* (2017.01)
*H01L 27/11573* (2017.01)
*H01L 27/11582* (2017.01)

(52) U.S. Cl.
CPC ........ *G11C 16/0483* (2013.01); *G06F 7/5443* (2013.01); *G11C 16/26* (2013.01); *H01L 27/1157* (2013.01); *H01L 27/11573* (2013.01); *H01L 27/11582* (2013.01)

(58) Field of Classification Search
CPC ... G11C 16/0483; G11C 16/26; G06F 7/5443; H01L 27/1157; H01L 27/11573; H01L 27/11582

USPC .................................................... 365/185.12
See application file for complete search history.

(56) References Cited

U.S. PATENT DOCUMENTS

| 6,173,029 B1* | 1/2001 | Xie | G06T 11/005 |
| | | | 378/4 |
| 2005/0231619 A1* | 10/2005 | Nakamura | H04N 5/3728 |
| | | | 348/303 |
| 2018/0046458 A1* | 2/2018 | Kuramoto | G06F 9/30036 |

* cited by examiner

*Primary Examiner* — Fernando Hidalgo
(74) *Attorney, Agent, or Firm* — J.C. Patents

(57) ABSTRACT

A 3D memory array device includes blocks, bit lines, word lines, source lines (SL), complementary metal oxide semiconductors (COMS), and SL sensing amplifiers (SA). Each block includes NAND strings, and each memory cell in the NAND strings stores one or more weights. The bit lines are respectively coupled as signal inputs to string select lines in all blocks. The word lines are respectively coupled to the memory cells, and the word lines in the same layer are as a convolution layer to perform a convolution operation on the inputted signal. Different SL are coupled to all ground select lines in different blocks to independently collect a total current of the NAND strings in each block. The CMOS are disposed under the blocks and coupled to each source line for transferring the total current to each SL SA, and a multiply-accumulate result of each block is outputted via each SL SA.

18 Claims, 11 Drawing Sheets

US 10,741,247 B1

3D MEMORY ARRAY DEVICE AND METHOD FOR MULTIPLY-ACCUMULATE

BACKGROUND

Technical Field

The disclosure relates to a 3D memory array device and a method for multiply-accumulate using the 3D memory array.

Description of Related Art

Artificial intelligence (AI) refers to the technology that presents human intelligence through computer programs. At present, superior standards in image recognition, language analysis, and board games, etc. are achieved.

Taking the AI network of image recognition as an example, the Convolutional Neural Network (CNN) is currently widely used to process image recognition, including huge numbers of multiply-accumulate (MAC) computations. However, since MAC computations require a large amount of weights ($w_{i,j}$) with multi-bit, a large amount of storage density is required, and the transmission time of the computed value is late due to the large amount of information. Therefore, the latest advanced AI hardware solutions are designed to deliver high performance and low power MAC solutions.

SUMMARY

The disclosure provides a 3D memory array device capable of performing multiply-accumulate (MAC) directly in a memory array with less data movement to save power and latency time.

The disclosure further provides a method for multiply-accumulate (MAC) using a 3D memory array, which may implement a MAC operation of in-memory computing (IMC) or processor-in-memory (PIM) and achieve a higher resolution of analog weight.

The 3D memory array device of the disclosure includes a plurality of blocks, a plurality of bit lines, a plurality of word lines, a plurality of source lines, a plurality of complementary metal oxide semiconductors (CMOS), and a plurality of source line sensing amplifiers (SL SA). Each block includes an array, and the array includes a plurality of NAND strings extended in the z direction, each NAND string includes a string select line (SSL), a ground select line (GSL), and a plurality of memory cells connected in series between the string select line and the ground select line, and each memory cell stores one or more weights ($w_{i,j}$). The bit lines are respectively coupled to a plurality of string select lines arranged along the y direction in the blocks, wherein each bit line is used as a signal input ($x_i$). The word lines are respectively coupled to the plurality of memory cells (i.e. $w_{i,j}$), wherein a plurality of word lines of the same layer are used as a convolution layer to perform a convolution operation $$\left( Sum(j) = \sum_{i=1}^{N} x_i \times w_{i,j} \right)$$

on all signals inputted from the bit lines. The plurality of source lines are respectively coupled to the ground select lines of all the NAND strings in the respective blocks to independently collect the total current of the NAND strings in the respective blocks. The CMOS are disposed under the blocks, and each CMOS is coupled to each source line as a switch. The source line sensing amplifiers are coupled to the respective source lines via the CMOS to receive the total current in each block and compare the total current with at least one reference level to output the multiply-accumulate (MAC) result of each block.

In an embodiment of the disclosure, the 3D memory array device may further include a plurality of common source line (CSL) switches disposed between the source lines to control the source lines to be disconnected or connected to each other.

In an embodiment of the disclosure, the 3D memory array device may further include a plurality of string select line (SSL) drivers respectively coupled to the string select lines (SSL) in each NAND string and configured to drive or float the string select lines.

In an embodiment of the disclosure, if the reference level is a reference voltage level, then the source line sensing amplifiers include a resistor or a capacitor to convert the total current into a voltage signal.

In an embodiment of the disclosure, the source line sensing amplifiers include NOR-type sensing amplifiers.

In an embodiment of the disclosure, the memory cells include flash memory cells.

In an embodiment of the disclosure, the number of the plurality of bit lines is 1,000 to 100,000.

In an embodiment of the disclosure, the memory cells include gate all-around (GAA) cells.

In an embodiment of the disclosure, the memory cells in each of the NAND strings are located at an intersection between a conductive pillar and the word lines, the conductive pillar includes a charge storage structure and a vertical channel structure, and the charge storage structure is in contact with the plurality of word lines.

In an embodiment of the disclosure, the device may further include a source terminal pad between each source line and all of the ground select lines in each block.

In an embodiment of the disclosure, the device may further include a drain terminal pad between each bit line and each string select line.

In an embodiment of the disclosure, the number of layers of the word lines is tens to hundreds of layers.

The method of the disclosure performs multiply-accumulate using a 3D memory array, the 3D memory array includes at least a plurality of bit lines, a plurality of NAND strings coupled to the bit lines, a plurality of word lines coupled to each NAND string, a plurality of source lines respectively coupled to the plurality of NAND strings in different blocks, a plurality of source line switches coupled to the plurality of source lines, and a plurality of source line sensing amplifiers coupled to the plurality of source line switches, wherein each NAND string includes a string select line (SSL), a ground select line (GSL), and a plurality of memory cells connected in series between the string select line and the ground select line. Each memory cell stores one or more weights, and the number of word lines of the same layer are used as a convolution layer. The method includes the following steps. The string select lines (SSL) of each NAND string in all blocks are turned on, different signals from the bit lines are inputted to the NAND strings in different blocks, a reference voltage (Vref) is applied to all word lines in the same convolution layer, a pass voltage (Vpass) is applied to the remaining unselected word lines, all source line switches are turned on to transfer the total current of the NAND strings in each block from each source line to each source line sensing amplifier so that the total current is received by each of the source line sensing amplifiers and is compared with at least one reference level to output a MAC result of each block.

In another embodiment of the disclosure, the MAC result is a "high" output if the total current is greater than the reference level.

In another embodiment of the disclosure, the MAC result is a "low" output if the total current is less than the reference level.

In another embodiment of the disclosure, the 3D memory array may further include string select line drivers coupled to the string select lines, respectively, and the string select lines are turned on by applying a same voltage $V_{DDI}$ to the string select lines.

In another embodiment of the disclosure, the different signals are signals inputted from different page buffers (PB).

In another embodiment of the disclosure, the source line switches include complementary metal oxide semiconductors (CMOS).

Based on the above, in the disclosure, independent source lines are used to collect currents of NAND string memory arrays of different blocks, and with CMOS under Array (CuA) technology, word line signals and source line signals may be separated by different blocks to achieve the collection of the total current of NAND strings of each block as a MAC result to implement in-memory operation (IMC) or the MAC operation of a processor-in-memory (PIM), so as to improve the resolution of analog weights.

It is to be understood that both the foregoing general description and the following detailed description are exemplary, and are not intended to limit the scope of the disclosure.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
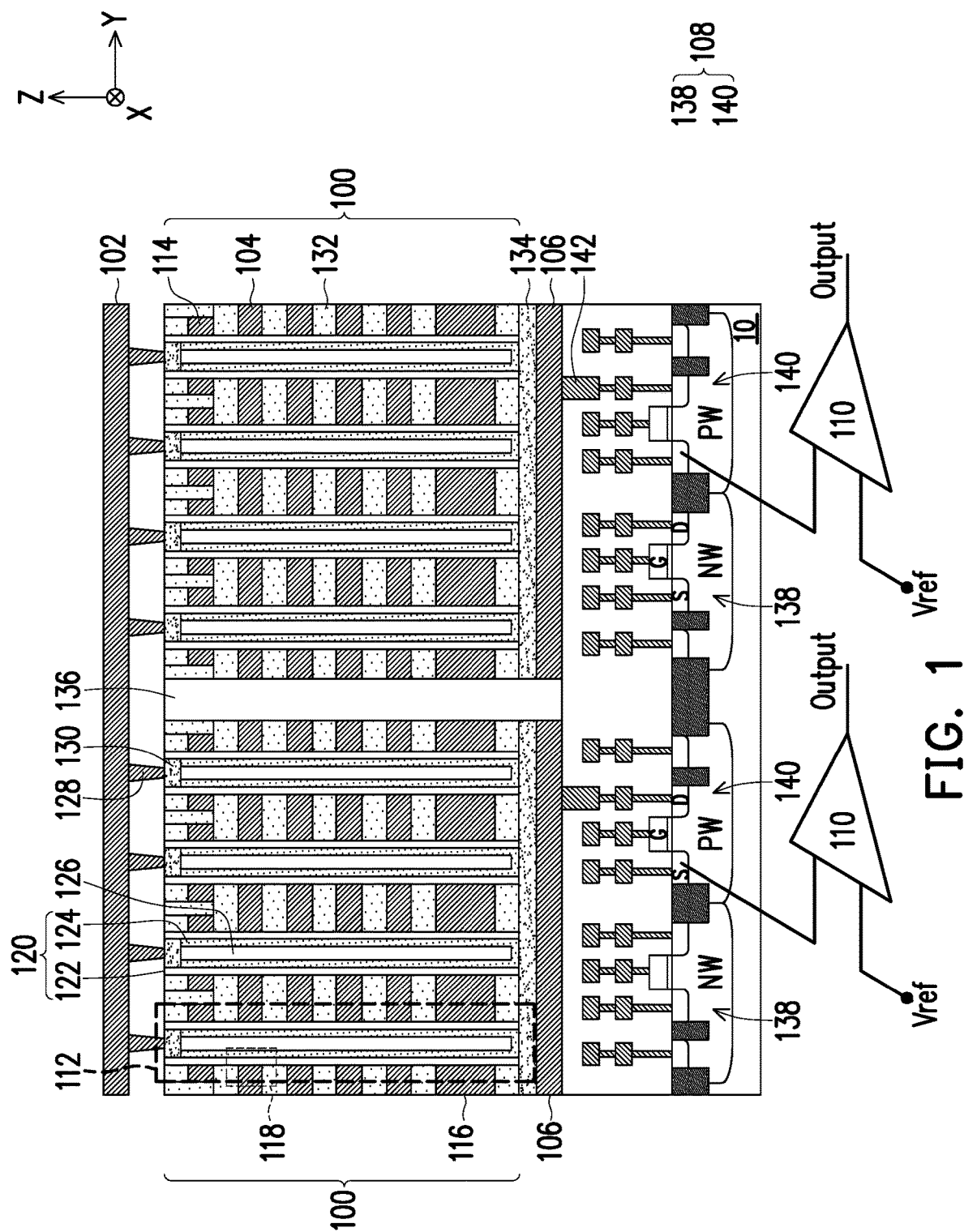
FIG. 1 is a cross section of a 3D memory array device according to the first embodiment of the disclosure.

A detailed description of embodiments of the present disclosure is provided with reference to the Figures. It is to be understood that there is no intention to limit the technology to the specifically disclosed structural embodiments and methods but that the technology may be practiced using other features, elements, methods, and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a cross section of a 3D memory array device according to the first embodiment of the disclosure.

Referring to FIG. 1, the 3D memory array device of the first embodiment includes a plurality of blocks 100, a plurality of bit lines 102, a plurality of word lines 104, a plurality of source lines 106, a plurality of complementary metal oxide semiconductors (CMOS) 108, and a plurality of source line sensing amplifiers (SL SA) 110. Although only two blocks 100 are shown in the figures, it is to be understood that the number of the blocks 100 may be increased to several tens to hundreds according to requirements, but the disclosure is not limited thereto. Each of the blocks 100 includes an array, and the array includes a plurality of NAND strings 112 extended in the Z direction, each of the NAND strings 112 includes a string select line (SSL) 114, a ground select line (GSL) 116, and a plurality of memory cells 118 connected in series between the string select line 114 and the ground select line 116, and each of the memory cells 118 stores one or more weights ($w_{i,j}$); for instance, a single level cell (SLC) can store one weight, a multi level cell (MLC) can store two weights, and so on, a triple level cell (TLC) can store three weights. In an embodiment, the memory cells 118 are, for example, flash memory cells and may be gate all-around (GAA) cells. In the present embodiment, the memory cells 118 in each of the NAND strings 112 are located at the intersection between a conductive pillar 120 and the word lines 104. The conductive pillar 120 includes a charge storage structure 122 and a vertical channel structure 124, and the charge storage structure 122 is in contact with the word lines 104. The charge storage structure 122 may include a multilayer dielectric charge trapping structure commonly used in flash memory technology, such as oxide-nitride-oxide (ONO); oxide-nitride-oxide-nitride-oxide (ONONO); oxide-nitride-oxide-nitride-oxide-nitride-oxide (ONONONO); silicon-oxide-nitride-oxide-silicon (SONOS); bandgap engineered silicon-oxide-nitride-oxide-silicon (BE-SONOS); tantalum nitride, aluminum oxide, silicon nitride, silicon oxide, silicon (TANOS); and metal-high-k bandgap-engineered silicon-oxide-nitride-oxide-silicon (MA BE-SONOS); or other charge-trapping layers or a combination of these layers. The vertical channel structure 124 is, for example, one or a plurality layers of polysilicon film. Additionally, the interior of the conductive pillar 120 may be filled with an insulating filler 126 (such as silicon dioxide).

In FIG. 1, the bit lines 102 are respectively coupled to a plurality of string select lines 114 arranged along the Y direction in each of the blocks 100, for example, electrically connected to drain terminal pads 130 via conductive plugs 128, wherein the drain terminal pads 130 are connected to the charge storage structure 122 and the vertical channel structure 124. Although only one bit line 102 is shown in the figure, it should be understood that the number of the bit lines 102 may be hundreds to hundreds of thousands, such as 1,000 to 100,000, and are densely distributed over all of the blocks 100. Each of the bit lines 102 may input a different bias ($V_{BL}$) as a signal input ($x_i$). The word lines 104 are respectively coupled to the plurality of memory cells (as $w_{i,j}$) 118, and an insulating layer 132 is between the word lines 104 of different layers to form a structure in which the conductive material and the insulating material are alternately stacked. Although only four layers of the word lines 104 are shown in the figures, it should be understood that the number of the word lines 104 (the number of layers) may be several tens to several hundreds, but the disclosure is not limited thereto. In the present embodiment, the plurality of word lines 104 of the same layer may function as a convolution layer to perform a convolution operation $$\left(Sum(j) = \sum_{i=1}^{N} x_i \times w_{i,j}\right)$$

on all signals inputted from the bit lines 102. The bit lines 102 may be metal wires. The conductive material of the word lines 104 may be an N+ or P+ polysilicon material or other conductive materials selected according to the compatibility with the charge storage structure 122, such as a metal, a metal nitride, a metal compound, or a combination of a metal and a metal compound.

Referring further to FIG. 1, the source lines 106 are respectively coupled to the ground select lines 116 of all the NAND strings 112 in the respective blocks 100 to independently collect the total current of all the NAND strings 112 in the respective blocks 100. For example, one source line 106 is coupled to all of the ground select lines 116 in one block 100, such as electrically connected via source terminal pads 134, wherein the source terminal pads 134 are connected to the charge storage structure 122 and the vertical channel structure 124. Since the source lines 106 of the different blocks 100 are not connected, the total current of the NAND strings 112 of the respective blocks 100 may be separately outputted. In addition, insulating isolation structures 136 may be disposed between the different blocks 100 and between the different source lines 106 to separate the different blocks 100 and separate the different source lines 106.

The CMOS 108 are disposed under the blocks 100, and each of the CMOS 108 is coupled to each of the source lines 106 as a switch. Since the CMOS 108 are directly formed on a substrate 10 under the NAND strings 112, the 3D memory array device of the present embodiment has all of the effects of high storage density, low cost, and reducing manufacturing cycle. The CMOS 108 typically include a PMOS 138 and an NMOS 140. If the NAND strings 112 are applied in a MAC calculation, one of the MOS may be used as a switch, such as the drain (D) of the NMOS 140 in the figure is in contact with a single source line 106 via an interconnect 142 to achieve coupling on the circuit. The source line sensing amplifiers 110 are coupled to the respective source lines 106 via the CMOS 108. The source line sensing amplifiers 110 of FIG. 1 are drawn in circuit form, which means that the source line sensing amplifiers 110 are connected from a peripheral circuit to the CMOS 108 under the blocks 100, but the disclosure is not limited thereto, such as the source line sensing amplifiers 110 may also be integrated into the range of the blocks 100 (e.g., above or below the blocks 100) via a circuit design. After the source line sensing amplifiers 110 receive the total current in each of the blocks 100, the source line sensing amplifiers 110 compare the total current in each of the blocks 100 with at least one reference level to output a multiply-accumulate (MAC) result of each of the blocks 100. In the present embodiment, if the reference level is a reference voltage level $V_{ref}$, then the source line sensing amplifiers 110 may include a resistor or a capacitor to convert the total current into a voltage signal. In an embodiment, the source line sensing amplifiers 110 are, for example, NOR-type sensing amplifiers.

Since FIG. 1 shows a structural view of one cross section, please refer to the corresponding circuit diagram (FIG. 2) for details of the relationship between the NAND strings, bit lines, word lines, and source lines in the 3D memory array device.

Figure 2:
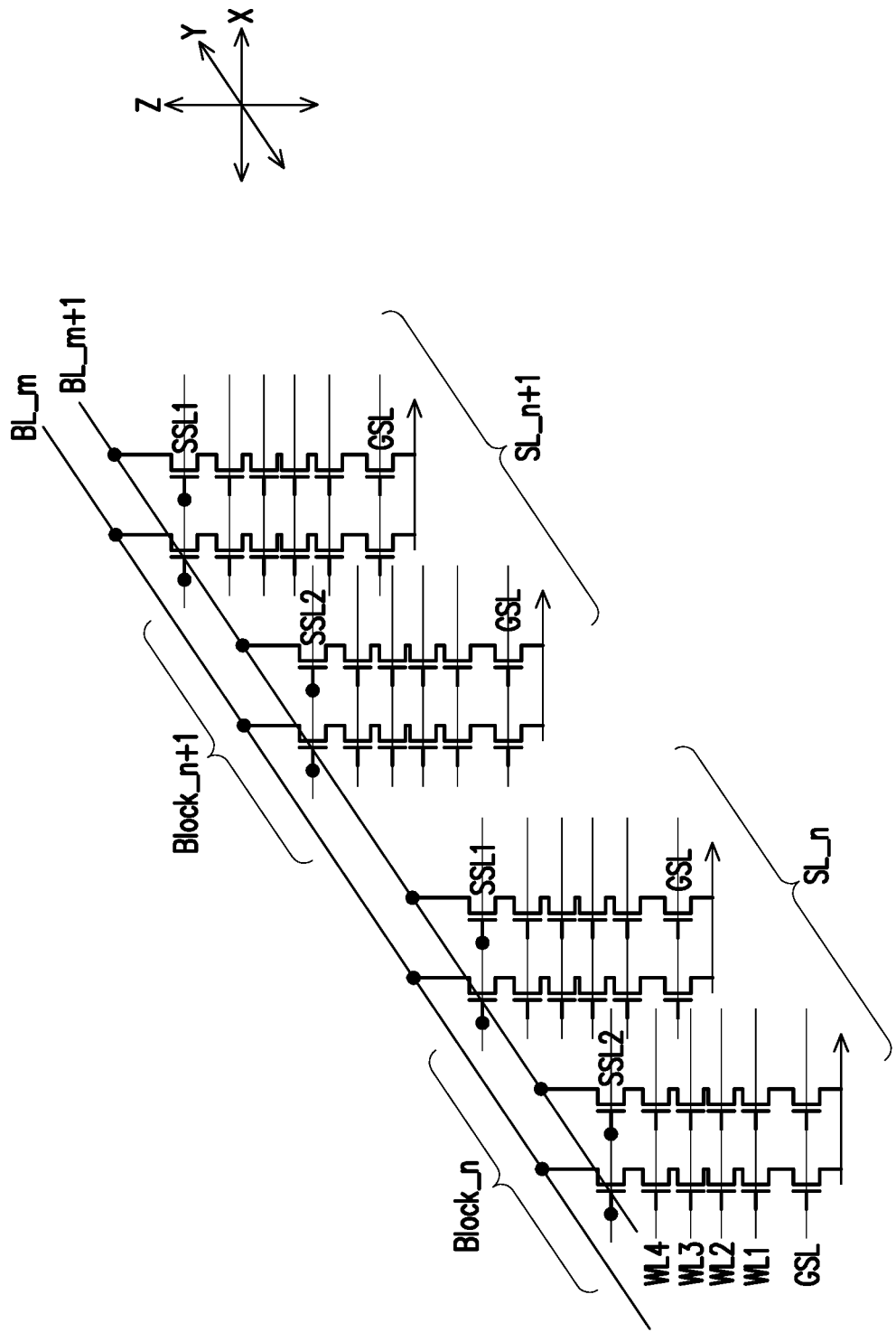
FIG. 2 is a circuit diagram of a 3D memory array in the first embodiment.

In FIG. 2, Block_n represents the nth block, Block_n+1 represents the n+1th block, BL_m represents the mth bit line, BL_m+1 represents the m+1th bit line, SL_n represents the nth source line, and SL_n+1 represent the n+1th source line. Each block includes an array, each array includes a plurality of NAND strings extended in the Z direction, and each NAND string includes a string select line SSL1 or SSL2, a ground select lines GSL, and memory cells connected in series between the string select line and the ground select line. The bit lines BL_m and BL_m+1 are coupled to the string select lines SSL1 and SSL2 arranged along the Y direction, and word lines WL1, WL2, WL3, and WL4 are coupled to the memory cells, respectively. The source line SL_n is coupled to the ground select line GSL of all NAND strings in the block Block_n, and the source line SL_n+1 is coupled to the ground select line GSL of all NAND strings in the block Block_n+1. Therefore, different bias ($V_{BL}$) data inputted by the different bit lines BL_m and BL_m+1 are transmitted to the blocks Block_n and Block_n+1 along the Y direction, and are transmitted along the X direction via the different source lines SL_n and SL_n+1 and transmitted to source line sensing amplifiers (not shown). The additional dimensions of the string select lines SSL1 and SSL2 in each block Block_n and Block_n+1 provide a plurality of units to sum the weights, thus providing a higher resolution of analog weight.

Figure 3:
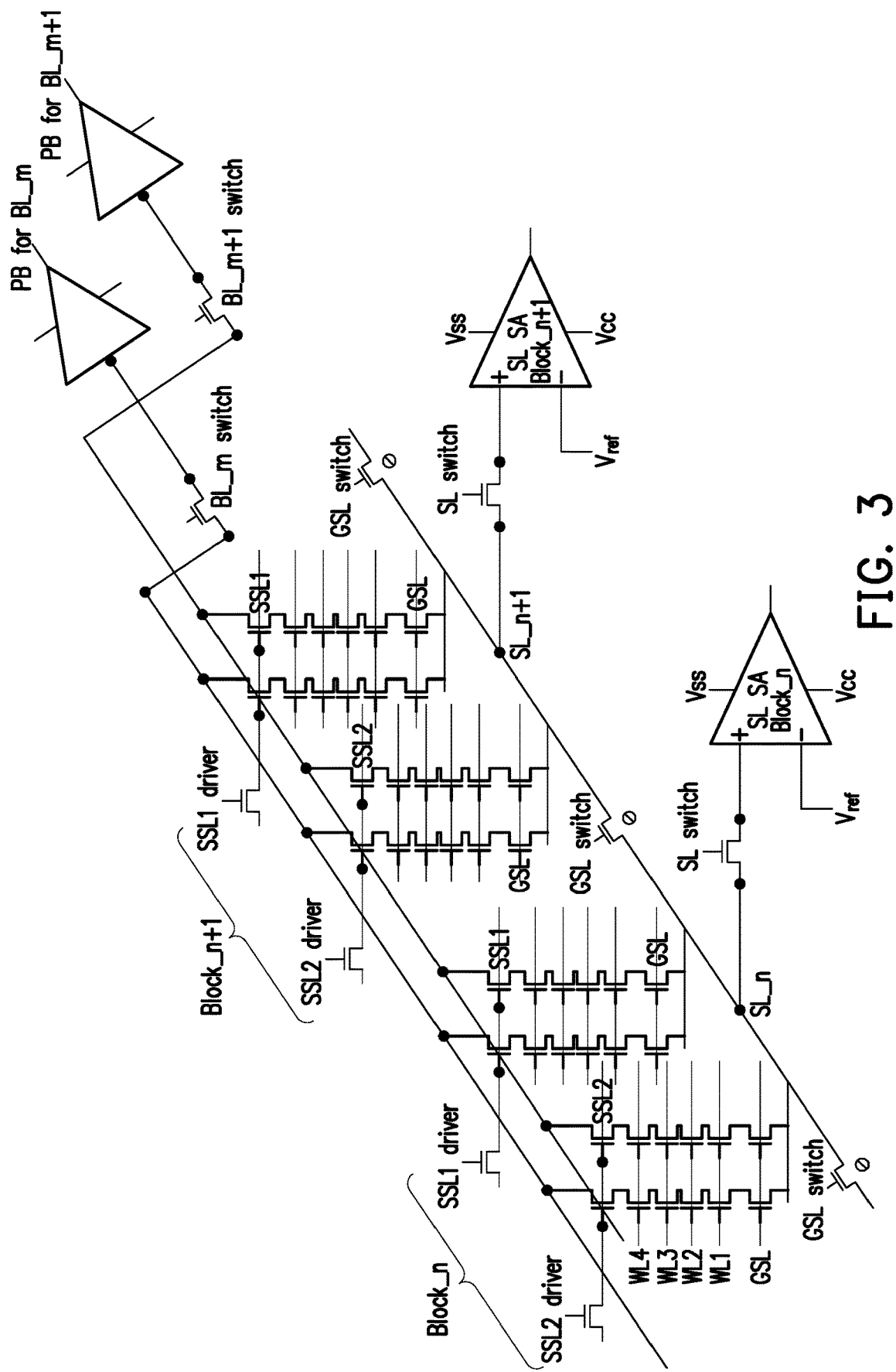
FIG. 3 is a circuit diagram of multiply-accumulate using a 3D memory array according to the second embodiment of the disclosure.

FIG. 3 is a circuit diagram of multiply-accumulate (MAC) using a 3D memory array according to the second embodiment of the disclosure, wherein the same circuit as in FIG. 2 is used to express the circuit connection relationship between the NAND strings, bit lines, word lines, and source lines in the 3D memory array, and related description is as provided for FIG. 2 and not repeated herein.

Referring to FIG. 3, in addition to NAND strings, the bit lines BL_m and BL_m+1, the word lines WL1 to WL4, and the source lines SL_n and SL_n+1, the 3D memory array of the second embodiment is also coupled to a source line switch SL switch of the source lines SL_n and SL_n+1 and coupled to the plurality of source line sensing amplifiers SL SA of the source line switch SL switch, wherein one memory cell in each NAND string is equivalent to storing one or more weights, while word lines of the same layer are used as convolution layers, that is, the word line WL1 is the first layer convolution layer, the word line WL2 is the second layer convolution layer; and so on. In the present embodiment, the 3D memory array device may further include a plurality of common source line switches CSL switch disposed between the source lines SL_n and SL_n+1 to control the source lines SL_n and SL_n+1 to be disconnected from each other or connected to each other. In addition, the 3D memory array device may further include a plurality of string select line drivers SSL1 driver and SSL2 driver, and the string select line driver SSL1 driver is coupled to the string select line SSL1 in each NAND string in the X direction and configured to drive or float the string select line SSL1; the string select line driver SSL2 driver is coupled to the string select line SSL2 in each NAND string in the X direction and configured to drive or float the string select line SSL2. The additional common source line switches CSL switch and/or string select line drivers SSL1 driver and SSL2 driver allow the 3D memory array to not only be applied in MAC operations but also be used for PGM operations, program verify (PV) operations, and ERS operations for training.

In the method of the present embodiment, the string select lines (SSL1 and SSL2) of each NAND string in all blocks (Block_n and Block_n+1) are turned on, and the common source line switches CSL switch are turned off, and different signals are inputted from the bit lines BL_m and BL_m+1 to the NAND strings in the blocks, wherein the method to turn on the string select lines SSL2 and SSL2 is to apply the same voltage $V_{DDI}$ to the string select line drivers SSL1 driver and SSL2 driver; the bit lines BL_m and BL_m+1 receive the input signals of the page buffer (PB) circuits thereof and transmit the input signals to all blocks. Bit line switches BL_m switch and BL_m+1 switch may be disposed between the page buffer circuits and the bit lines BL_m and BL_m+1. Then, the reference voltage (Vref) is applied to all of the word lines WL4 of the same convolution layer, and a pass voltage (Vpass) is applied to the remaining unselected word lines WL1 to WL3, and all source line switches SL switch are turned on to transfer the total current of the NAND strings in the block Block_n from the source line SL_n to the source line sensing amplifiers SL SA coupled thereto and transfer the total current of the NAND strings in the block Block_n+1 from the source line SL_n+1 to the source line sensing amplifier SL SA coupled thereto. Under such an operation, the word line WL4 of the same layer performs a convolution operation on all the signals inputted from the bit lines BL_m and BL_m+1 as a convolution layer to obtain a total current $I_{SL\_n}=V_{BL\_m} \times w_{(1-1,2)}+V_{BL\_m+1} \times w_{(2-1,2)}+V_{BL\_m} \times w_{(1-2,2)}+V_{BL\_m+1} \times w_{(2-2,2)}$ of the block Block_n, and so on.

In the present embodiment, the source line sensing amplifiers SL SA are, for example, NOR-type sensing amplifiers, which are high-speed (about 300 ns) sensing amplifiers and are capable of sensing a multi-level current in a short time. When the total current from each block enters each of the source line sensing amplifiers SL SA, if the reference level ($V_{ref}$) is the reference voltage level, then the total current may be converted first by an internal resistor or capacitor into a voltage signal and then compared with the reference level $V_{ref}$ to output a multiply-accumulate (MAC) result of each block. For example, if the total current is greater than the reference level Vref, then the MAC result is a "high" output; conversely, if the total current is smaller than the reference level $V_{ref}$, then the MAC result is a "low" output. In an embodiment, the reference level may be a plurality of reference values for hierarchical MAC result output.

Figure 4:
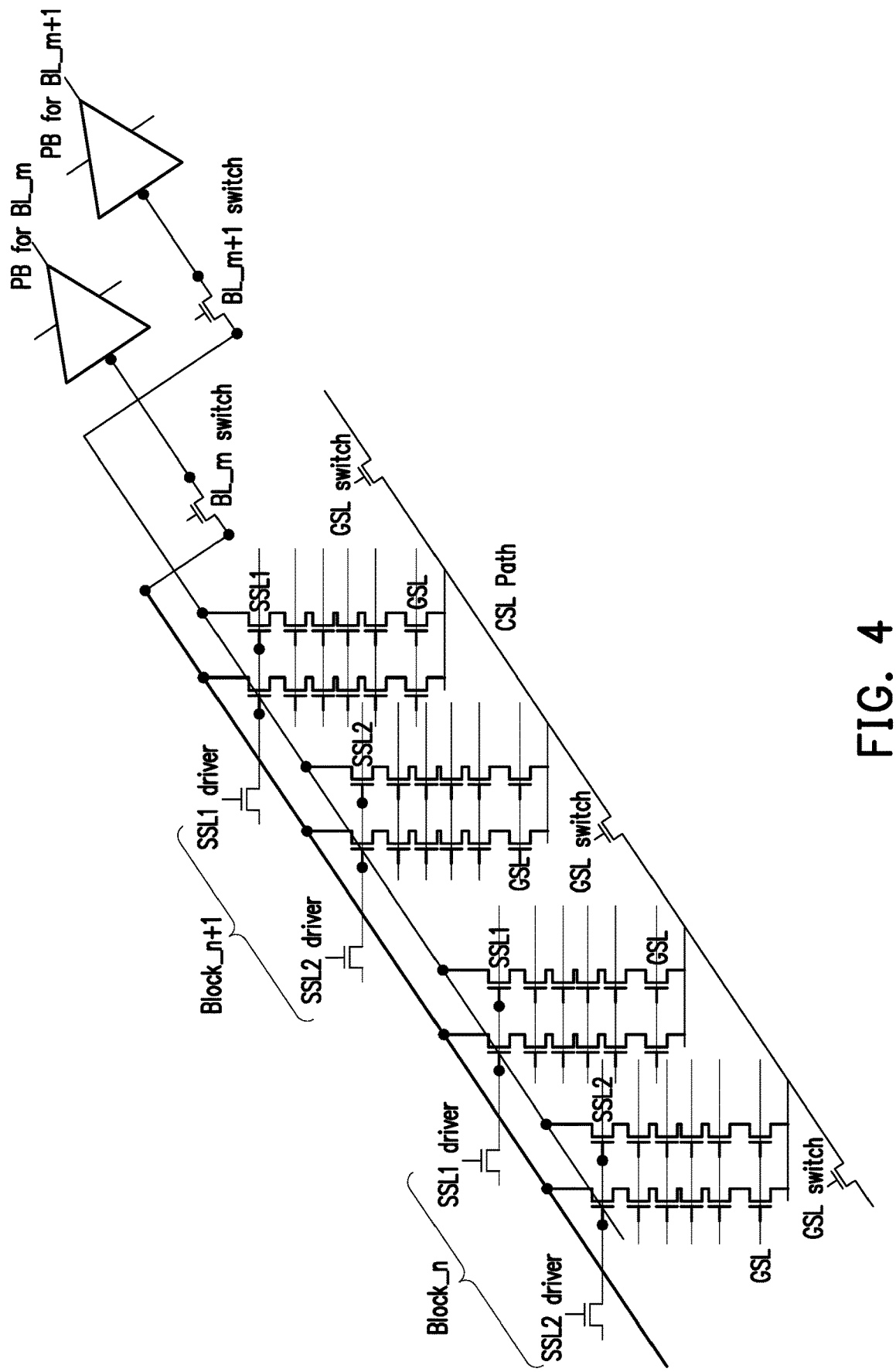
FIG. 4 is a circuit diagram of training using the 3D memory array of the second embodiment.

FIG. 4 is a circuit diagram of training using the 3D memory array of the second embodiment, wherein the same circuit as that of FIG. 3 is used and related description is as provided for FIG. 3 and not repeated herein.

Since artificial intelligence is a technology that presents human intelligence through computer programs, a lot of training is required before it may be practically applied. FIG. 4 is a circuit for training, wherein all of the common source line switches CSL switch need to be turned on to generate a common source line path, and all of the source line switches are turned off, and therefore the source line switches and the source line sensing amplifiers that do not participate in the circuit are omitted in FIG. 4.

At the PGM operation, the plurality of bit lines BL_m and BL_m+1 simultaneously provide program patterns from the PB circuits thereof. Only one page may be programmed at a time; for example, only one specific SSL1 of one selected block Block_n may be turned on at a time, and other SSL2 are turned off to prevent duplicate codes from being programmed on unselected pages. Typically, the common source line CSL bias $V_{DDI}$ is, for example, 2.3 V during PGM operation, while all of the word lines WL1 to WL4 of other blocks Block_n+1 are floating. Vpgm (such as 16 V to 26 V) is applied to the selected word line, and Vpass is applied to the other WL in the selected block Block_n.

Whether PGM results pass from the PB circuits thereof may be detected/verified during program verify (PV) operations. Only one page may be verified at a time; for example, only one specific SSL of one selected block Block_n may be turned on at a time. Other SSL are turned off to prevent error messages from being collected. Typically, during PV operations, CSL bias $V_{SS}$ is, for example, 0 V and $V_{BL}$ is, for example, 0.5 V to 1 V, while all word lines WL1 to WL4 of other blocks Block_n+1 are floating. Each PB circuit may determine whether the selected memory cell is high Vt or low Vt by the internal capacitance inside the PB. When one memory cell Vt is high enough, this memory cell will be disabled during the remaining PGM. $V_{ref}$ for verification is applied to the selected word line, and Vpass is applied to the other WL in the selected block Block_n.

During the ERS operation, all bit line switches BL_m switch and BL_m+1 switch are turned off and all string select line drivers SSL1 driver and SSL2 driver are turned off so that all SSL gate signals are floating to prevent hot carrier interference. 20 V is supplied at CSL nodes to increase channel potential. A bias of about 6 V to 8 V is applied to the ground select line GSL gate of the selected block Block_n to generate a GIDL source. Each WL gate bias of the selected block Block_n is 0 V to perform Fowler-Nordheim (FN) erase. All WL and GSL gate biases of the unselected block Block_n+1 remain floating, and therefore the gate biases are coupled during ERS as ERS inhibition.

The bias values used in the above operations are merely exemplary values, and the disclosure is not limited thereto.

Figure 5:
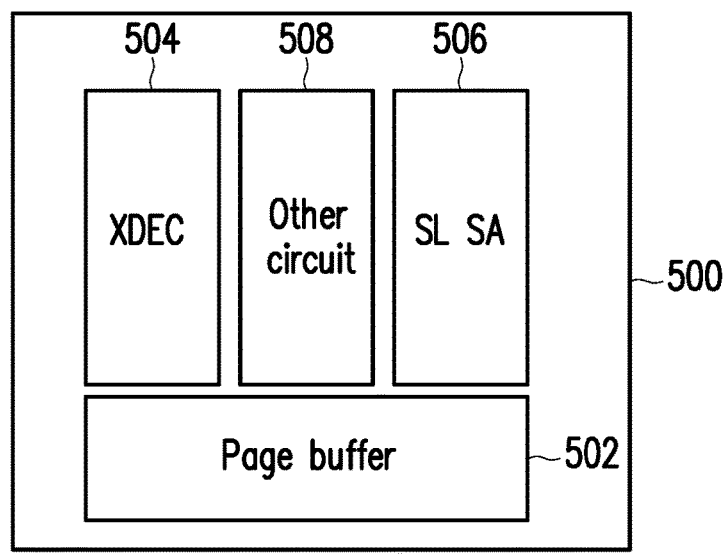
FIG. 5 is a layout view of a semiconductor chip containing a 3D memory array device according to the third embodiment of the disclosure.

FIG. 5 is a schematic of the layout of a semiconductor chip according to the techniques of the disclosure.

In FIG. 5, a semiconductor chip 500 includes a page buffer 502, a column decoder (XDEC) 504, source line sensing amplifiers (SL SA) 506, and other circuits 508, etc., wherein the layout of the page buffer 502 includes the 3D memory array device of the disclosure, and the source line sensing amplifiers 506 are the source line sensing amplifiers in the 3D memory array device of the disclosure. The column decoder 504 is a gate decoder. The manufacturing flow of the 3D memory array in the page buffer 502 is described below.

FIG. 6A to FIG. 6G are schematics of the manufacturing process of the 3D memory array device of the third embodiment, wherein the same members are denoted by the same reference numerals as the first embodiment, and related description is as provided for the first embodiment and not repeated herein.

Figure 6A:
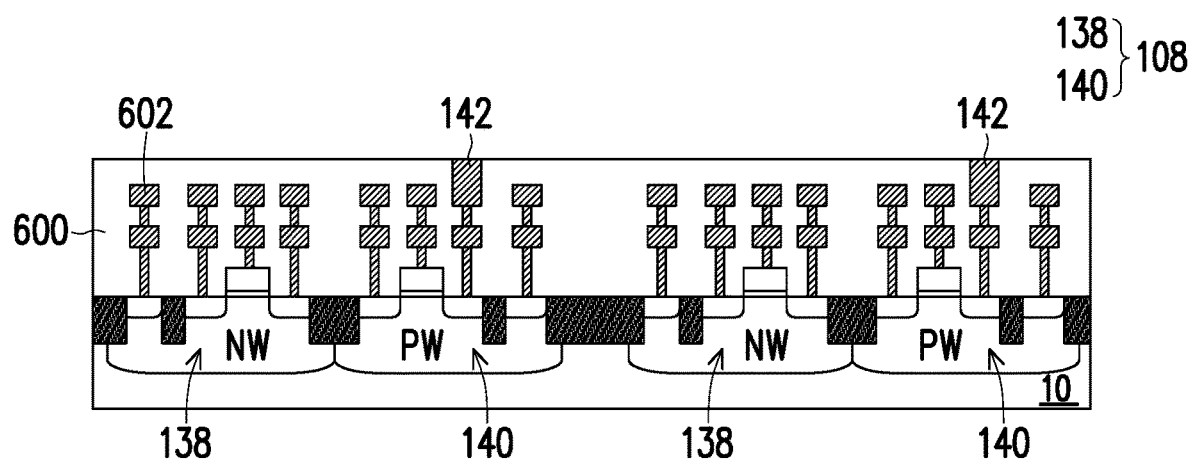
FIG. 6A to FIG. 6G are schematics of a manufacturing flow of the 3D memory array device of the third embodiment.

Referring to FIG. 6A, the plurality of complementary metal oxide semiconductors (CMOS) 108 are first formed on the substrate 10. The process of the CMOS 108 can refer to the existing technology, and the CMOS 108 typically include the PMOS 138 and the NMOS 140. Then, an inter-layer dielectric layer 600 and an interconnect 602 are formed on the CMOS 108, and although one inter-layer dielectric layer 600 is shown in the figure, it should be understood that in order to match the connection of the remaining circuits, the number of layers of the inter-layer dielectric layer 600 and the interconnect 602 may actually be a plurality. In particular, an interconnect 142 connected to the subsequent source lines (SL) is formed at the NMOS 140 terminal.

Figure 6B:
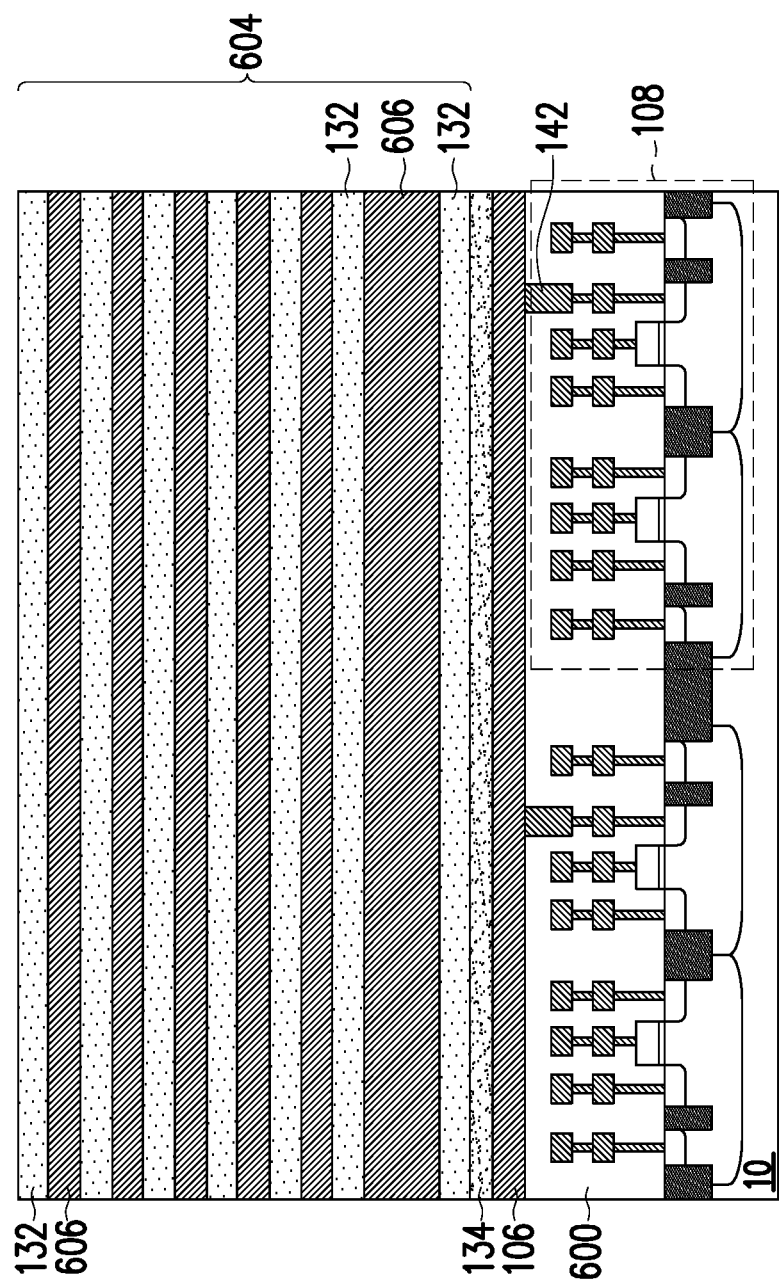

Then, referring to FIG. 6B, a conductive stack 604 is formed over the CMOS 108. The conductive stack 604 includes the source line 106, a plurality of conductive layers 606, and the insulating layer 132 located between the conductive layers 606, wherein the source line 106 is typically a metal layer, and therefore a layer such as a conductive layer of doped polysilicon may be first formed on a surface 106a thereof as the source termination pads 134. The interconnect 142 in the figure is in contact with the source lines 106.

Figure 6C:
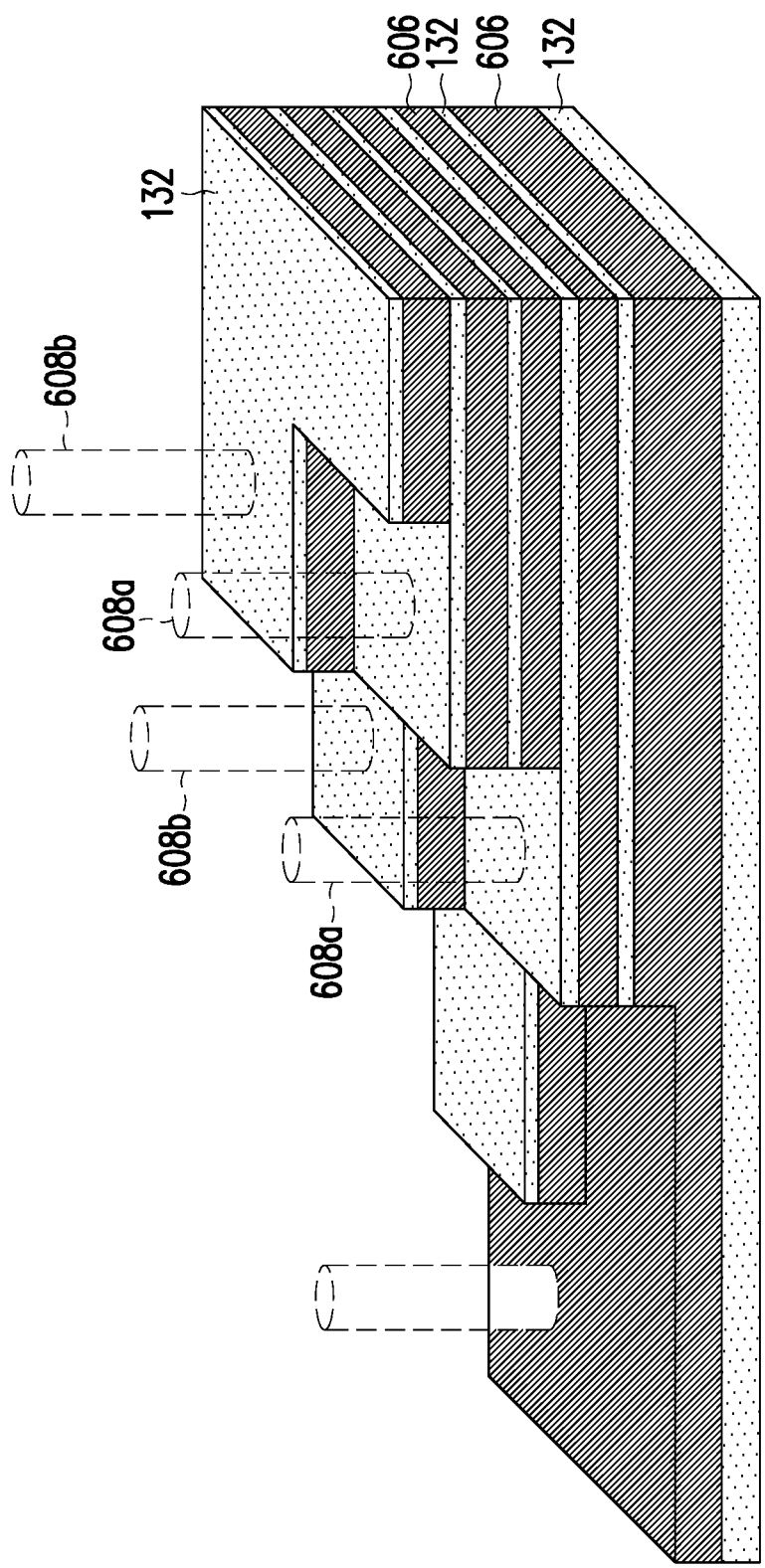

Next, referring to FIG. 6C, since the 3D memory array has the plurality of conductive layers 606, in order to reduce the overall resistivity of the conductive layers 606 to reduce the signal transmission latency phenomenon caused by gate resistance and capacitance, the present embodiment utilizes many steps of lithography-etching processes to make the even-numbered and odd-numbered conductive layers 606 stepped-shaped to facilitate the connection of plug structures 608a and 608b to an external circuit. For example, FIG. 6C is an example of five conductive layers 606 at the edge of one single block, and the remaining structural layers are omitted, wherein the plug structures 608a connected to the even-numbered conductive layers 606 are arranged on the stepped conductive stack 604 along a direction, and the plug structures 608b connected to the odd-numbered conductive layers 606 are also arranged on the stepped conductive stack 604 along the direction, but at a location behind the plug structures 608a. However, the disclosure is not limited thereto, and the connection manner of the foregoing circuit may also be as provided in other existing technology.

Figure 6D:
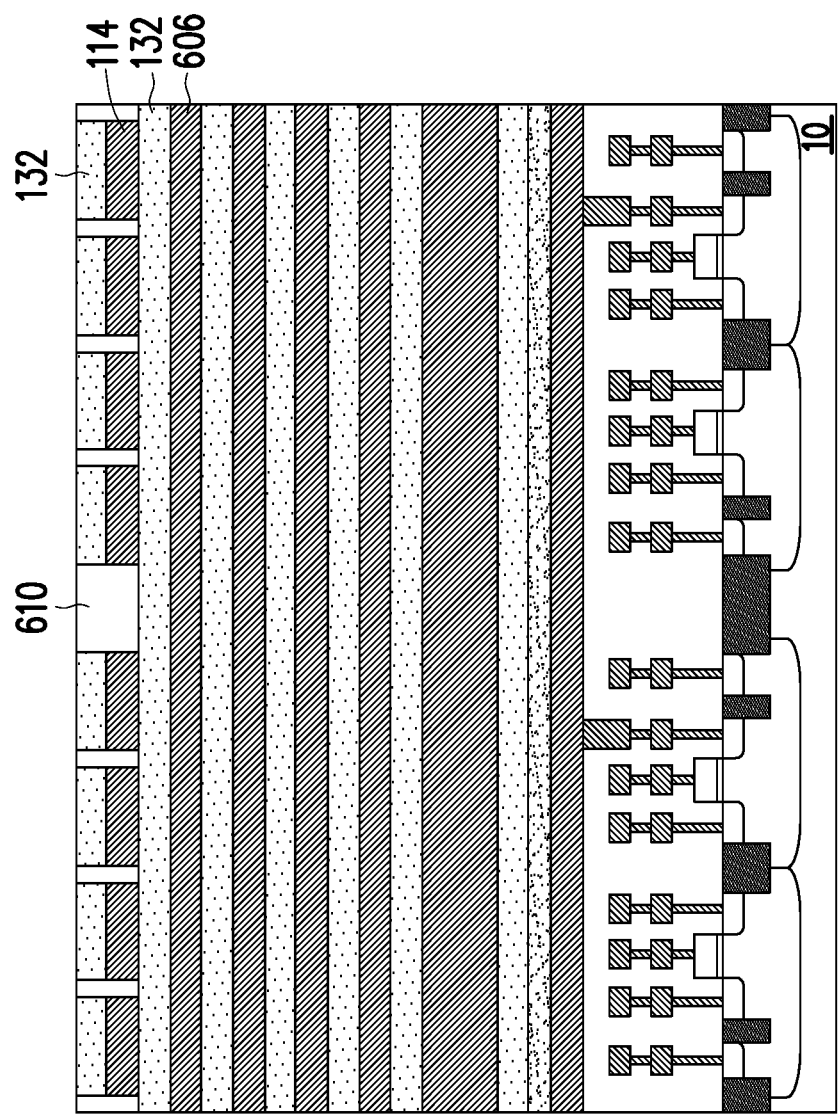

Then, referring to FIG. 6D, the top insulating layer 132 and the underlying conductive layer are etched away to form the string select lines 114. Thereafter, an insulating material 610 may be filled between the string select lines 114.

Figure 6E:
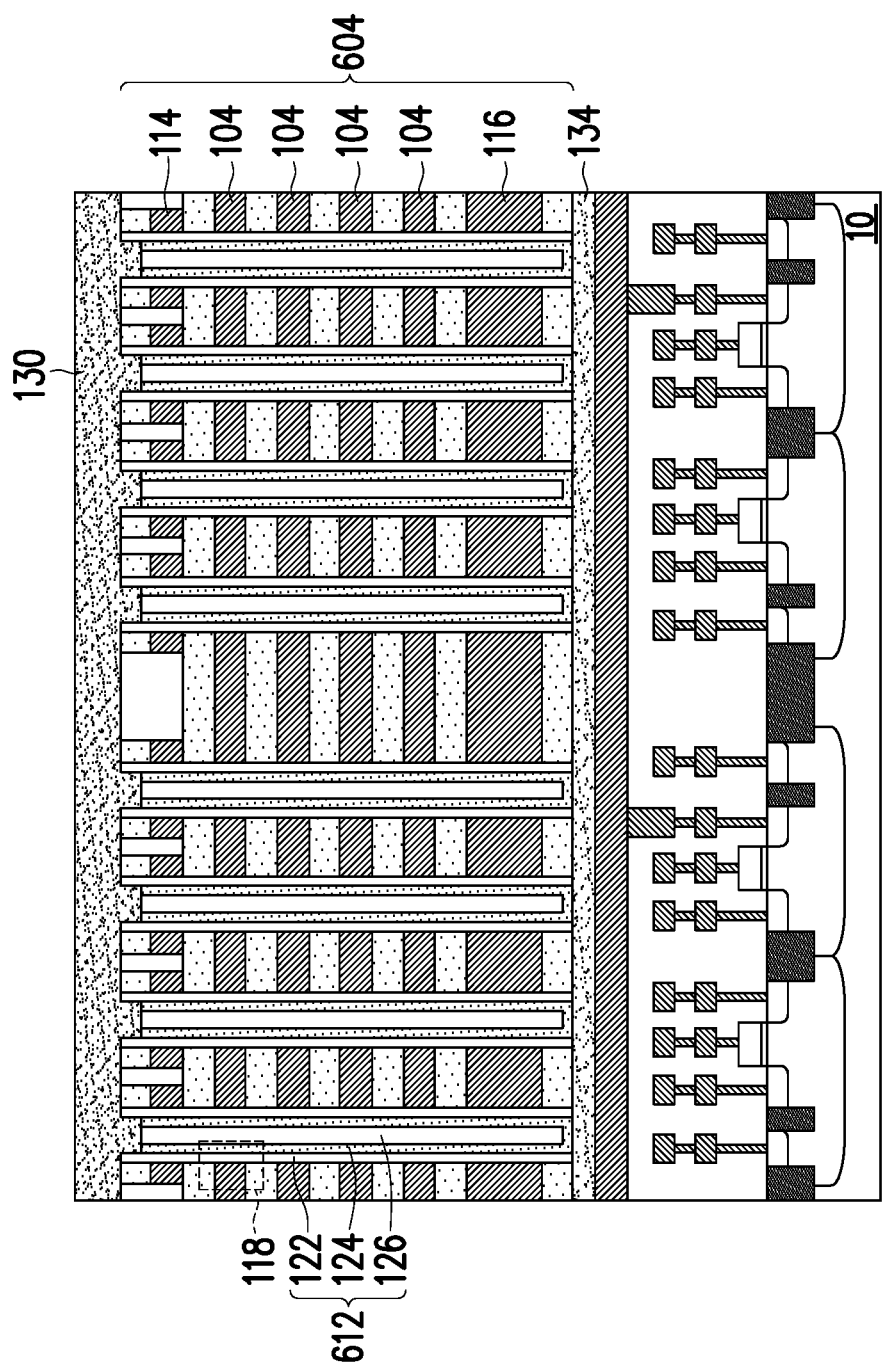

Subsequently, referring to FIG. 6E, a plurality of conductive pillars 612 are formed in the conductive stack 604. In detail, a plurality of through openings may be formed in the conductive stack 604 to expose the source terminal pads 134, and the charge storage structures 122 and the vertical channel structures 124 may be orderly formed in the through openings to form the memory cells 118 at intersections between the conductive pillars 612 and the conductive layers 606 used as word lines, and the conductive layers become the word lines 104 and the ground select lines 116. In addition, the insulating filler 126 may be filled in the interior of each of the conductive pillars 612. Then, a layer such as a conductive layer of doped polysilicon is formed on top of the conductive pillars 612 as the drain terminal pads 130.

Figure 6F:
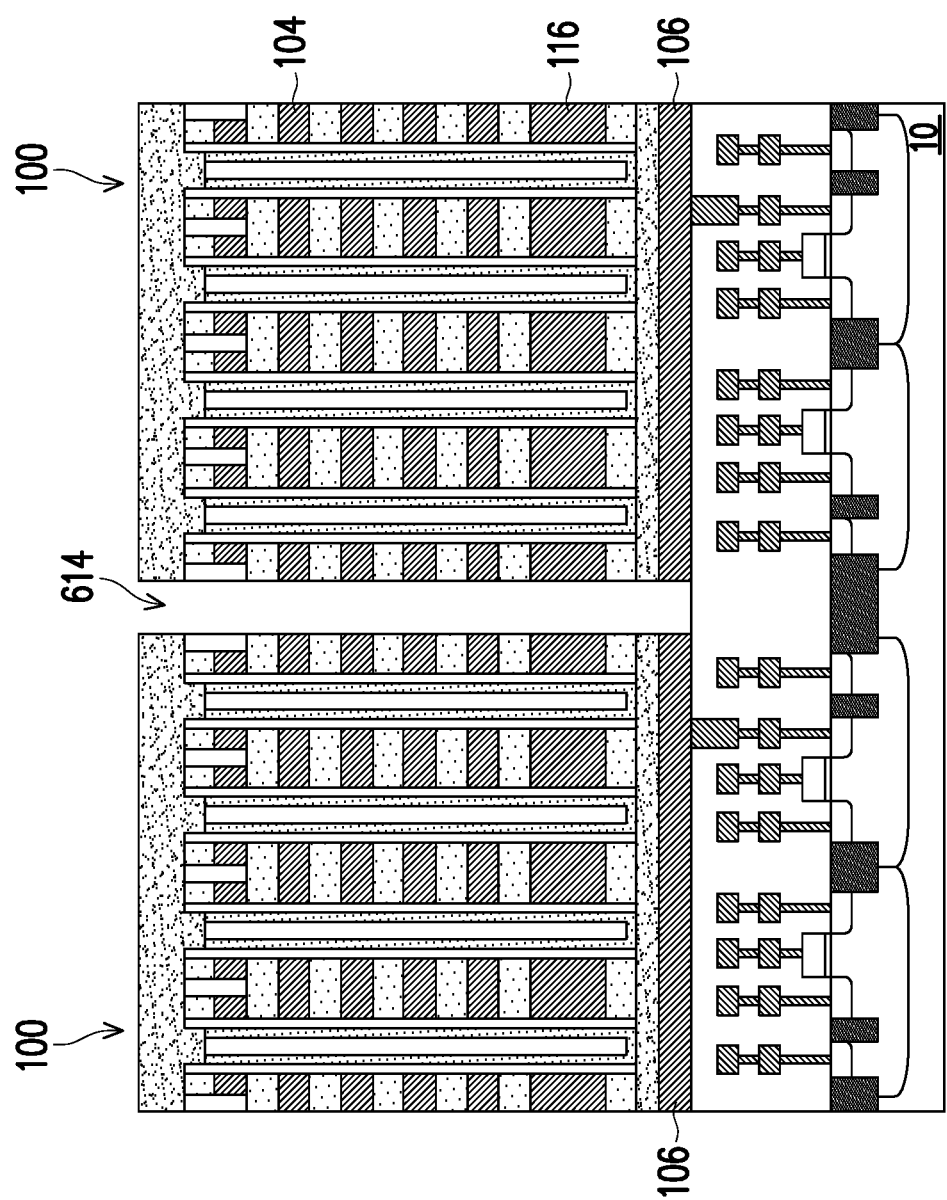

Next, referring to FIG. 6F, in order to isolate the signals of the different blocks 100, all the circuits of two blocks 100 (including the ground select line 116, the word lines 104, and the source line 106) are cut by an etching process to form trenches 614.

Figure 6G:
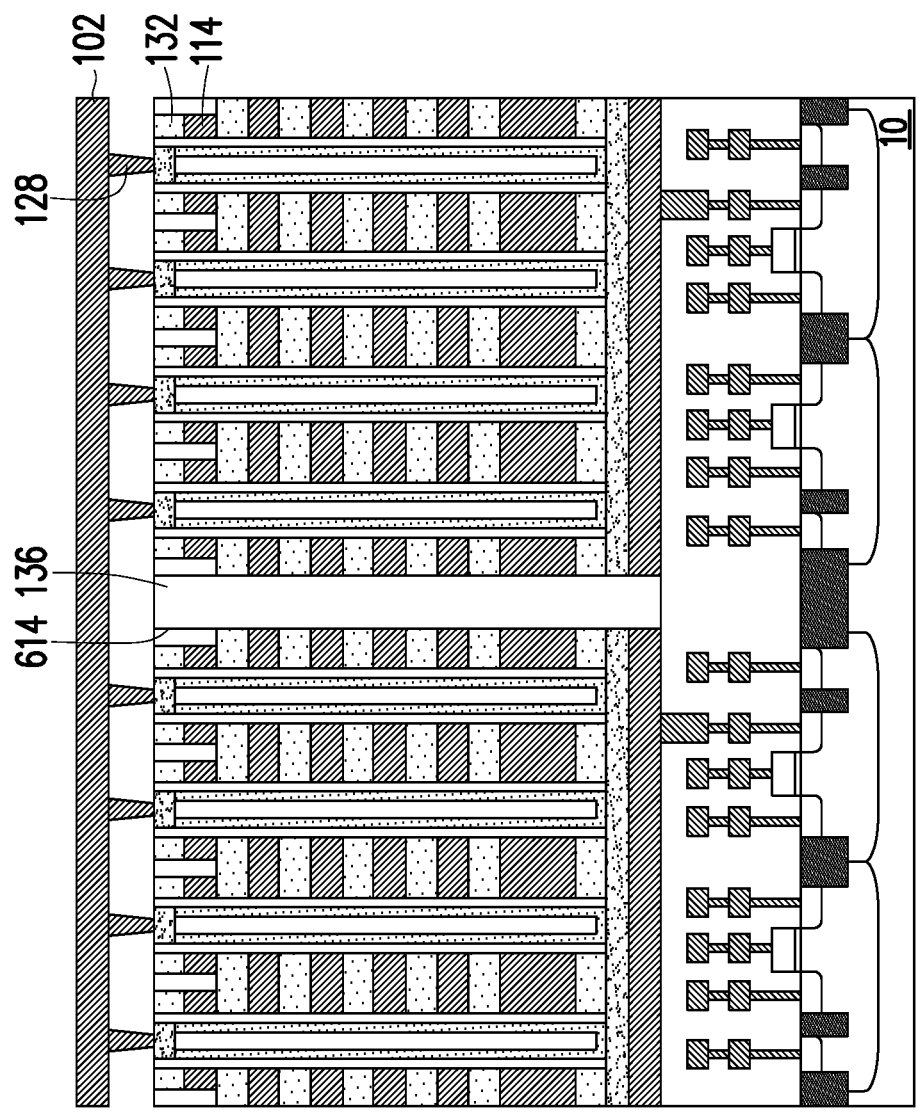

Then, referring to FIG. 6G, the insulating isolation structures 136 are first filled in the trenches 614, and then a planarization process is performed until the topmost insulating layer 132 is exposed. Then, the conductive plugs 128 and the bit lines 102 are formed on the blocks 100 to couple the string select lines 114 in all of the blocks 100. In addition, the wiring of the peripheral circuits (such as the plug structures 608a and 608b of FIG. 6C, etc.) may be formed prior to forming the conductive plugs 128.

Based on the above, in the disclosure, a memory array of a 3D NAND string is applied to a MAC operation, wherein independent source lines are used to collect currents of NAND string memory arrays of different blocks, and with CuA technology, word line signals and source line signals may be separated by different blocks to achieve the collection of the total current of the NAND strings of each block as a MAC result to implement in-memory operation (IMC), thereby increasing the resolution of analog weights. Moreover, the disclosure may also be integrated into the process of existing 3D NAND strings.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A 3D memory array device, comprising:
 a plurality of blocks, wherein each of the blocks comprises an array, the array comprises a plurality of NAND strings extended in a z direction, and each of the NAND strings comprises a string select line (SSL), a ground select line (GSL), and a plurality of memory cells connected in series between the string select line and the ground select line, wherein each of the memory cells stores one or more weights ($w_{i,j}$);
 a plurality of bit lines respectively coupled to the plurality of string select lines arranged along a y direction in the plurality of blocks, wherein each of the bit lines is used as a signal input ($x_i$);
 a plurality of word lines respectively coupled to the plurality of memory cells, wherein the plurality of word lines of a same layer are used as a convolution layer to perform a convolution operation

$$\left(Sum(j) = \sum_{i=1}^{N} x_i \times w_{i,j}\right)$$

on a signal inputted from the bit lines;
 a plurality of source lines respectively coupled to the plurality of ground select lines of all of the NAND strings in the blocks to independently collect a total current of the plurality of NAND strings in each of the blocks;
 a plurality of complementary metal oxide semiconductors (CMOS) disposed under the plurality of blocks, and each of the CMOS is coupled to each of the source lines as a switch; and
 a plurality of source line sensing amplifiers respectively coupled to the plurality of source lines via the plurality of CMOS to receive the total current in each of the blocks and compare the total current with at least one reference level to output a multiply-accumulate (MAC) result of each of the blocks.

2. The 3D memory array device of claim 1, further comprising a plurality of common source line (CSL) switches disposed between the plurality of source lines to control the plurality of source lines to be disconnected or connected.

3. The 3D memory array device of claim 1, further comprising a plurality of string select line drivers respectively coupled to the string select lines in each of the NAND strings and configured to drive or float the string select lines.

4. The 3D memory array device of claim 1, wherein the reference level is a reference voltage level, and the source line sensing amplifiers comprise a resistor or a capacitor to convert the total current into a voltage signal.

5. The 3D memory array device of claim 1, wherein the source line sensing amplifiers comprise NOR-type sensing amplifiers.

6. The 3D memory array device of claim 1, wherein the memory cells comprise flash memory cells.

7. The 3D memory array device of claim 1, wherein a number of the plurality of bit lines is 1,000 to 100,000.

8. The 3D memory array device of claim 1, wherein the memory cells comprise gate all-around (GAA) cells.

9. The 3D memory array device of claim 1, wherein the memory cells in each of the NAND strings are located at an intersection between a conductive pillar and the word lines, and the conductive pillar comprises a charge storage structure and a vertical channel structure, and the charge storage structure is in contact with the plurality of word lines.

10. The 3D memory array device of claim 1, further comprising a source terminal pad between each of the source lines and the ground select lines in each of the blocks.

11. The 3D memory array device of claim 1, further comprising a drain terminal pad between each of the bit lines and each of the string select lines.

12. The 3D memory array device of claim 1, wherein a number of layers of the word lines is tens to hundreds of layers.

13. A method for multiply-accumulate (MAC) using a 3D memory array, wherein the 3D memory array comprises at least a plurality of bit lines, a plurality of NAND strings coupled to the bit lines, a plurality of word lines coupled to each of the NAND strings, a plurality of source lines respectively coupled to the plurality of NAND strings in different blocks, a plurality of source line switches coupled to the plurality of source lines, and a plurality of source line sensing amplifiers coupled to the plurality of source line switches, wherein each of the NAND strings comprises a string select line (SSL), a ground select line (GSL), and a plurality of memory cells connected in series between the string select line and the ground select line, wherein each of the memory cells stores one or more weights, and the plurality of word lines of a same layer are used as a convolution layer, the method comprising:
- turning on the string select line of each of the NAND strings in all of the blocks;
- inputting different signals from the plurality of bit lines to the plurality of NAND strings in the different blocks;
- applying a reference voltage (Vref) to the word lines in the same convolution layer and applying a pass voltage (Vpass) to remaining unselected word lines;
- turning on all of the source line switches to transfer a total current of the plurality of NAND strings in each of the blocks from each of the source lines to each of the source line sensing amplifiers; and
- receiving the total current using each of the source line sensing amplifiers and comparing the total current to at least one reference level to output a multiply-accumulate result of each of the blocks.

14. The method for multiply-accumulate using the 3D memory array of claim 13, wherein the multiply-accumulate result is a "high" output when the total current is greater than the at least one reference level.

15. The method for multiply-accumulate using the 3D memory array of claim 13, wherein the multiply-accumulate result is a "low" output when the total current is less than the at least one reference level.

16. The method for multiply-accumulate using the 3D memory array of claim 13, wherein the 3D memory array further comprises string select line drivers coupled to the string select lines, respectively, and a method of turning on the string select lines is to apply a same voltage $V_{DDI}$ to the string select line drivers.

17. The method for multiply-accumulate using the 3D memory array of claim 13, wherein the different signals are signals inputted from different page buffers (PB).

18. The method for multiply-accumulate using the 3D memory array of claim 13, wherein the source line switches comprise complementary metal oxide semiconductors (CMOS).

* * * * *